US007376872B1

(12) United States Patent
Nelson et al.

(10) Patent No.: US 7,376,872 B1
(45) Date of Patent: May 20, 2008

(54) TESTING EMBEDDED MEMORY IN INTEGRATED CIRCUITS SUCH AS PROGRAMMABLE LOGIC DEVICES

(75) Inventors: Michael Nelson, Austin, TX (US); Robert Feather, Austin, TX (US); Hemanshu Vernenker, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 241 days.

(21) Appl. No.: 10/978,899

(22) Filed: Nov. 1, 2004

(51) Int. Cl.
*G11C 29/00* (2006.01)
*G01R 31/28* (2006.01)

(52) U.S. Cl. ....................................... 714/718; 714/724

(58) Field of Classification Search ..................... None
See application file for complete search history.

(56) References Cited

U.S. PATENT DOCUMENTS

| | | | | |
|---|---|---|---|---|
| 5,673,270 | A | 9/1997 | Tsujimoto | |
| 5,768,288 | A * | 6/1998 | Jones | 714/725 |
| 6,003,150 | A | 12/1999 | Stroud | |
| 6,141,779 | A * | 10/2000 | Hill et al. | 714/710 |
| 6,202,182 | B1 | 3/2001 | Abramovici | |
| 6,550,023 | B1 | 4/2003 | Brauch et al. | |
| 6,785,846 | B2 * | 8/2004 | Li | 714/30 |
| 2003/0221151 | A1 * | 11/2003 | Agarwal | 714/725 |

* cited by examiner

*Primary Examiner*—Christine T Tu

(57) ABSTRACT

Method and apparatus for the testing of embedded memories in integrated circuits such as programmable logic devices are disclosed. In conjunction with a partial BIST engine, an external tester provides the embedded memories with test vectors. The on-chip partial BIST engine retrieves the test vectors from the embedded memories and compares them to corresponding expected test vectors supplied by the external tester. Based upon the comparison, the on-chip partial BIST engine forms comparison results indicating whether the retrieved test vectors differ from the corresponding expected test vectors. For programmable logic devices, a full BIST engine may be configured in the integrated circuit for generating the test vectors on chip.

4 Claims, 5 Drawing Sheets

TESTING EMBEDDED MEMORY IN INTEGRATED CIRCUITS SUCH AS PROGRAMMABLE LOGIC DEVICES

TECHNICAL FIELD

The present invention relates generally to embedded memories, and more particularly to the testing of embedded memories in integrated circuits such as programmable logic devices.

BACKGROUND

High-density modern semiconductor processes allow designers to shrink what would have been a board-level system into just a single system-on-a-chip (SOC) integrated circuit. As part of this integration, memories that would have existed as separate integrated circuits become embedded memories within a SOC. Although the resulting integration provides a very compact design, the testing of SOCs becomes more and more challenging as the number of integrated components rises. This testing may be classified into two categories, namely that of testing logic and testing memory. Testing embedded memories, such as SRAM's, is more difficult than testing dedicated memory chips because of the relative inaccessibility of the embedded memory. This testing difficulty manifests itself in several ways, such as in memory writing, memory reading, and the memory data path width to the input/output (IO) facilities of the integrated circuit. Should the embedded memories be used as read-only memory (ROM), a user will also need to configure the memories before operation of the integrated circuit. The need to configure and test embedded memories exacerbates the already considerable die area demands of embedded memories.

Conventional approaches for testing embedded memories have included the use of on-chip hardware such as a built-in-self-test (BIST) engine. In a BIST engine, a BIST controller generates test patterns (typically denoted as test vectors) that are written to and read back from the embedded memories. The originally-written test vectors are compared to the read test vectors so that errors in the embedded memories may be identified. Although testing embedded memories with BIST engines is relatively fast, the BIST engine occupies substantial die area and hence raises the die cost. Moreover, the test patterns are limited to whatever patterns the BIST engine has been designed to generate, thereby limiting the resulting fault coverage as well as the failure analysis. Finally, the BIST engine itself could be faulty, thus lowering manufacture yield and increasing costs.

An alternative to the on-chip BIST engine embedded memory testing approach is the use of conventional external testers. These external testers generate the test vectors that make up the test pattern that is written to the embedded memory. In such an approach, the die demands from an on-chip BIST engine is eliminated. Moreover, the external tester has greater flexibility in the variety of test patterns/test vectors that may be generated. However, the external tester must retrieve the written test vectors that comprise a given test pattern from the embedded memory being tested and compare the retrieved test vectors to the expected values for the retrieved test vectors. To limit output pin demands, the retrieved data words are typically shifted off chip in a serial fashion. Accordingly, external testing approaches are necessarily slower than on-chip BIST engine implementations.

Accordingly, there is a need in the art for improved testing and configuration capabilities for embedded memories.

SUMMARY

In accordance with one aspect of the invention, an integrated circuit is provided that includes: at least one embedded memory operable to store test vectors from an external tester; and a comparison circuit operable to retrieve test vectors from the at least one embedded memory and to compare the retrieved test vectors to corresponding expected vectors provided by the external tester to form comparison results indicating whether the retrieved test vectors differ from the corresponding expected vectors. In one embodiment, the integrated circuit comprises a programmable logic device.

In accordance with another aspect of the invention, a method of testing memory function in an integrated circuit having at least one embedded memory is provided that includes the acts of: writing test vectors supplied by an external tester to the at least one embedded memory; retrieving the test vectors from the at least one embedded memory; and within the integrated circuit, comparing the retrieved test vectors to corresponding expected test vectors supplied by the external tester to form comparison results indicating whether the retrieved test vectors differ from the corresponding expected vectors. In one embodiment, the integrated circuit comprises a programmable logic device.

In accordance with another aspect of the invention, a programmable logic device is provided, comprising: at least one embedded memory; and a plurality of logic blocks, the plurality of logic blocks being configured to perform the acts of: writing test vectors to the at least one embedded memory; retrieving the test vectors from the at least one embedded memory; and comparing the retrieved test vectors to corresponding expected test vectors to provide comparison results indicating whether the retrieved test vectors differ from the corresponding expected vectors.

In accordance with another aspect of the invention, a method of testing an embedded memory within a programmable logic device is provided. The method includes the acts of: writing test vectors to the embedded memory; retrieving the test vectors from the embedded memory; and within the programmable logic device, comparing the retrieved test vectors to corresponding expected test vectors to provide comparison results indicating whether the retrieved test vectors differ from the corresponding expected vectors.

DETAILED DESCRIPTION

Figure 1:
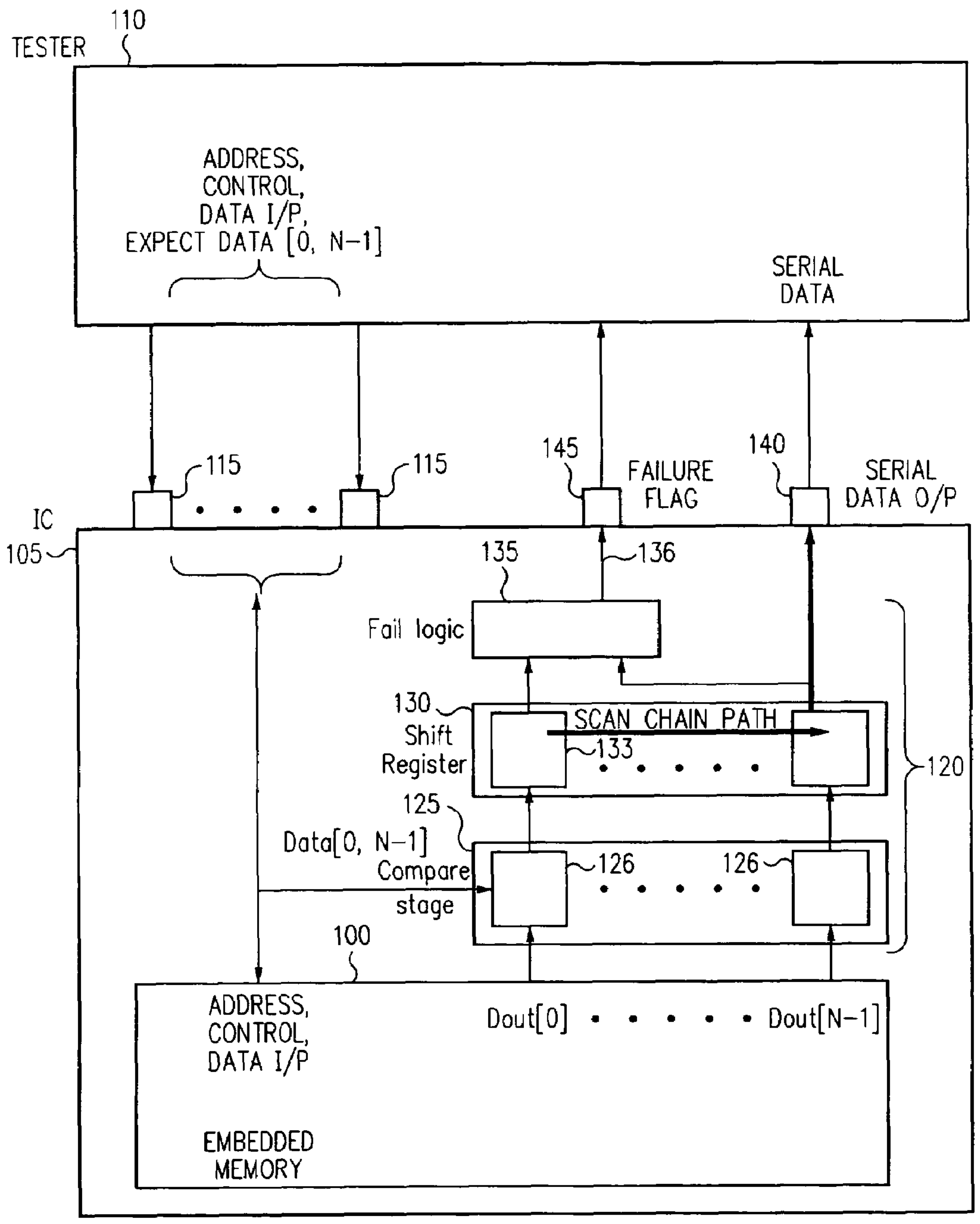
FIG. 1 is a block diagram of a partial BIST embedded memory testing architecture in accordance with an embodiment of the invention.

The present invention provides a testing and configuration architecture for integrated circuit and programmable logic device embedded memories. Rather than use on-chip BIST circuitry in this architecture to generate test vectors, an external tester generates the test vectors and their corresponding addresses. This architecture may be better understood in reference to the drawings. Turning now to FIG. 1, an embedded memory 100 within an integrated circuit (IC) 105 couples to an external tester 110. External tester 110 generates test vectors comprising data input (I/P) and corresponding address and control data and couples all of these signals to IC 105 through input pads or terminals 115. In this fashion, embedded memory 100 may be configured with the appropriate test vectors. Each test vector will typically correspond to the word width of the embedded memory being tested. For example, if the embedded memory being tested has a word width of 8 bits, each test vector would be 8 bits. Each test vector is written to the appropriate address within embedded memory 100. However, it will be appreciated that the width of the test vectors may vary from the word width of the embedded memory being tested. In the following discussion, it will be assumed without loss of generality that the width of the test vectors and the embedded memory word width are the same.

Embedded memory 100 has a certain memory depth corresponding to the number of words it can store. This memory depth will be designated with an integer D. Thus, tester 110 writes D test vectors to embedded memory 100 to complete its configuration. It will be appreciated that the configuration process just described for embedded IC 105 is analogous to a configuration process that must be performed by any conventional external tester. In other words, a conventional external tester must be able to generate and write test vectors to all available word locations in the embedded memory being tested to completely configure embedded memory 100. However, as discussed previously, the memory verification time for external testers suffers in comparison to an on-chip BIST approach. To obtain the greater test pattern flexibility advantages offered by external testers without suffering from their speed disadvantages, IC 105 includes an on-chip comparison stage 120. Because comparison stage 120 is on-chip but the generation of test vectors is performed by external tester 110, the embedded memory verification architecture shown in FIG. 1 may be denoted as a "partial BIST" testing architecture.

As will be explained further herein, comparison stage 120 may include a compare stage 125, a result shift register 130, and a fail logic circuit 135. Having configured embedded memory 100 with the desired test pattern (which may be comprised of test vectors written to every available word location), tester 110 may then command the retrieval of the written test vectors by supplying their addresses through input pads 115. To verify proper operation of embedded memory 100, each retrieved test vector should be compared to an expected test vector (the originally written test vector). Thus, tester 110 not only supplies the address of a test-vector-to-be-retrieved over input pads 115 but also the expected test vector at that address. Compare stage 125 receives the expected test vector and compares each of its bits with the corresponding bits in the retrieved test vector. For example, the retrieved test vector having a width of N bits may be represented by the word Dout[0, N−1]. Similarly, the expected test vector may be represented by the word Data[0, N−1]. Should embedded memory 100 be operating correctly, each bit of word Dout should match the corresponding bit in word Data. For example, Dout[3] should equal Data[3]. Given such a bit-by-bit comparison, compare stage 125 may be implemented as N sub-stages 126, wherein each sub-stage performs the comparison for a particular bit.

Figure 2:
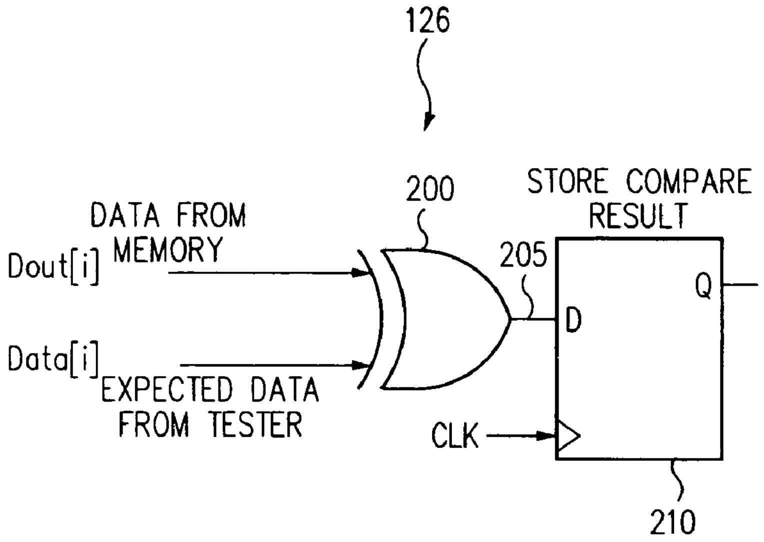
FIG. 2 is a schematic illustration of a comparison sub-stage circuit for the embedded memory testing architecture of FIG. 1 in accordance with an embodiment of the invention.

It will be appreciated that a number of logical circuit constructions may be used to implement comparison sub-stages 126. For example, turning now to FIG. 2, a comparison sub-stage 126 for an arbitrary bit location i in words Data and Dout may be implemented using an XOR gate 200. As known in the arts, an output 205 from XOR gate 200 can only be asserted high if the binary logical states of Data[i] and Dout[i] are different. Thus, if output 205 is asserted high by XOR gate 200, embedded memory 100 has erroneously stored the bit Dout[i]. The assertion of output 205 may be stored in a result register 210 for later communication to tester 110. Because tester 110 knows the address of the retrieved data word Dout, tester 110 may determine the precise bit storage location within embedded memory 110 that is faulty. By observing output 205 for every possible memory location, tester 110 may thus construct what is denoted as a "bitmap" for embedded memory 100 that identifies each faulty bit storage location.

To complete the bitmap, tester 110 will need the results for each and every bit comparison. For example, in some embodiments, the result register results could be transmitted in parallel from IC 105 to tester 110 using N output pads. However, to reduce the required number of output pads, the results may be serially shifted to tester 110 using a single serial output pad 140. To perform this serial shifting, the results stored in result registers 210 may be coupled to shift register 130. Shift register 130 forms a scan chain path that couples through output pad 140 to tester 110. However, there may be embodiments wherein a user is not interested in such a detailed fault analysis. Instead, a user may simply want to know whether the embedded memory has any faults or not. For example, a binary failure flag may be used to represent a failure state. Should the failure flag be asserted, embedded memory 100 has one or more faults. If the failure flag is not asserted after all memory locations have been checked, embedded memory 100 has no faults.

Figure 3:
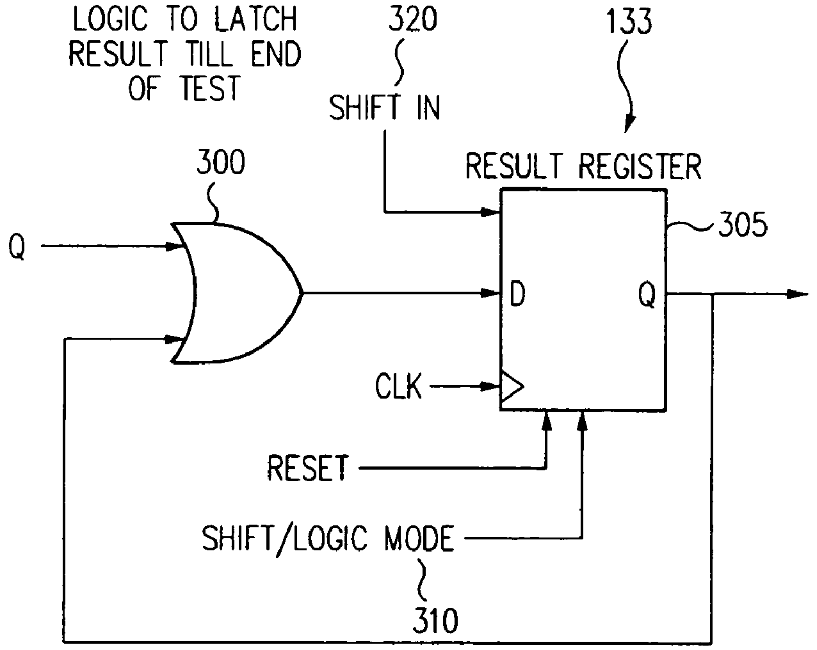
FIG. 3 is a block diagram of a portion of a result shift register for the embedded memory testing architecture of FIG. 1 in accordance with an embodiment of the invention.

To enable both modes of operation (bit map vs. failure flag), shift register 130 may comprise a serial connection of shift register sub-stages 133. An exemplary embodiment of sub-stage 133 is illustrated in FIG. 3 for the processing of the ith bit comparison between Data[i] and Dout[i]. As discussed with respect to FIG. 2, this ith bit comparison may be stored as a Q signal in result register 210. This Q signal is received by an OR gate 300 where it is ORed with a Q signal stored by a result register 305. The D input for result register 305 is formed from the output for OR gate 300. Prior to beginning verification of embedded memory 100, all result registers 305 may be reset. The Q output is thus initially a logical zero, which will have no effect on the Q signal from result register 210. Upon processing an initially-retrieved test vector, each result register will thus store the Q signal from result register 210. Consider the case if the Q signal for register 305 is asserted high, indicating a fault at the ith bit location in the retrieved test vector, Dout[i]. If the reset signal is not re-asserted during the remainder of the embedded memory verification, this Q signal will stay high because of the recycling through OR gate 300. Referring again to FIG. 1, the Q signals from registers 305 may be received by fail logic 135. Fail logic 135 may thus be implemented as an N-bit wide OR gate (not illustrated) that collapses the N Q signals from registers 305 by ORing them to form a binary failure flag 136. Binary failure flag 136 couples through an output pad 145 to tester 110. Verification of embedded memory 100 using binary failure flag 136 may be denoted as a failure logic mode of verification.

Should a user 110 desire a bitmap rather than simply knowing whether there were one or more failures as represented by failure flag 136, a shift mode rather than a failure logic mode may be enabled through an appropriate assertion of a shift/logic mode control signal 310 to each register 305. In a shift mode, each register 305 would be reset prior to receiving the comparison results from each retrieved test vector Dout. By resetting in this fashion, the Q signals in registers 305 from previous retrieved test vector comparisons do not alter the comparison results for the currently retrieved test vector Dout as may happen in the failure mode because of the previously-described recycling though OR gates 300. Once the comparison results are stored in registers 305, they may be serially shifted out in the conventional shift register fashion. Thus, the Q signal from register 305 for the ith bit comparison shifts in as a shift in signal 320 to the register 305 for the (i+1)th bit comparison, and so on. After an appropriate number of shifts, all the comparison results will have been serially shifted through output pad 140 to tester 110, which may then incorporate them into the bitmap being completed.

Figure 4:
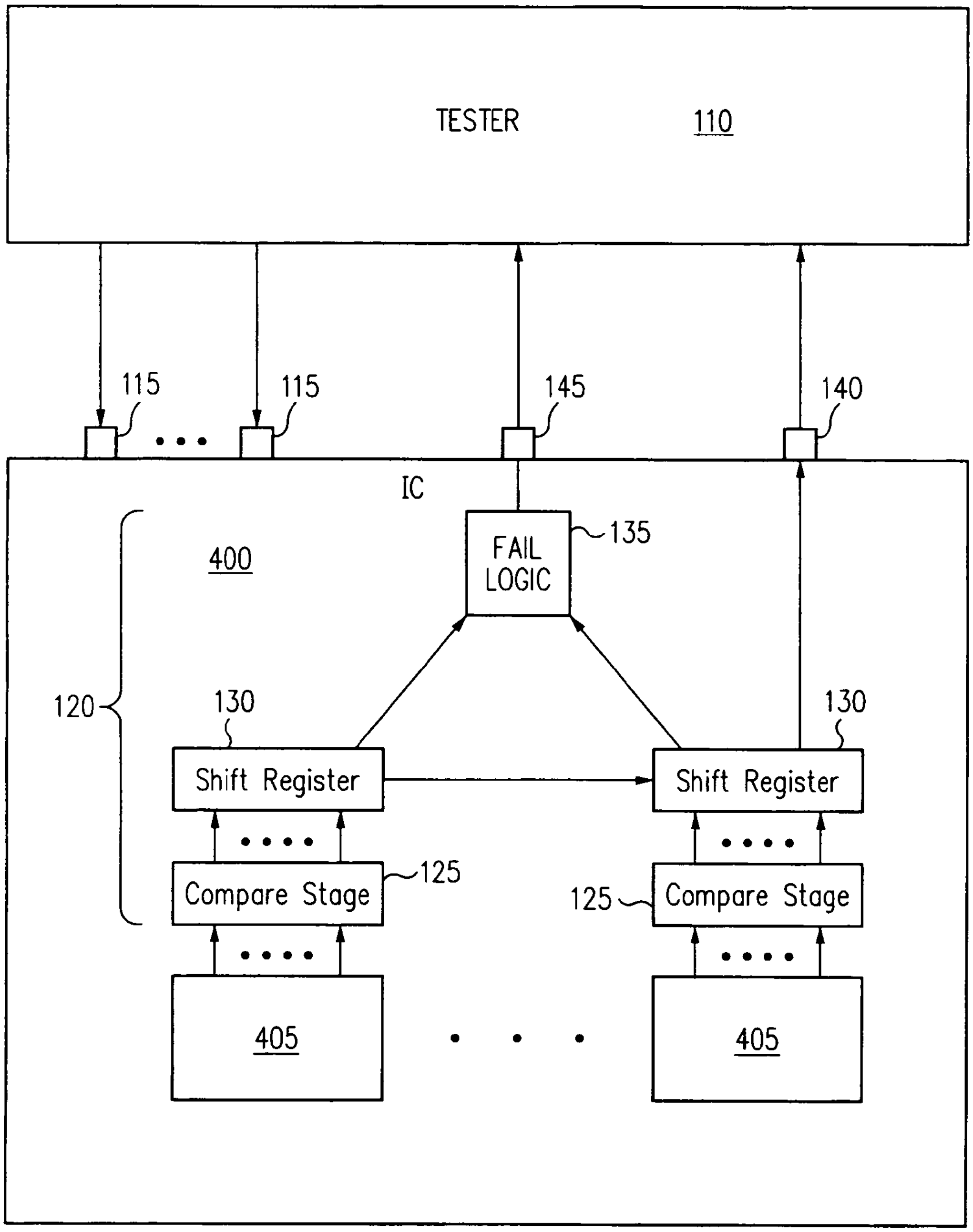
FIG. 4 is a block diagram of a partial BIST embedded memory testing architecture in accordance with an embodiment of the invention.

It will be appreciated that the partial BIST architecture discussed with respect to FIG. 1 may be applied to integrated circuits having a plurality of embedded memories. For example, a partial BIST architecture for an integrated circuit 400 having a plurality of embedded memories 405 is illustrated in FIG. 4. In the embodiment illustrated, each embedded memory 405 has the same word width and depth such that the test pattern written to each embedded memory 405 is the same. However, the partial BIST architecture discussed herein may be applied to an integrated circuit having embedded memories of varying word and depth size. During verification, each embedded memory sequentially provides retrieved data words Dout to compare stages 125 as discussed with respect to FIGS. 1 and 2. Each compare stage 125 provides a comparison result to a shift register 130 as discussed with respect to FIGS. 1, 2, and 3. Should a shift mode be enabled, the various bit comparison results from registers 305 (FIG. 3) are serially shifted out through output pad 140 to tester 110. Alternatively, a failure logic mode using fail logic 135 as discussed with respect to FIG. 1 may be enabled.

The partial BIST architecture described herein may also be applied to programmable logic devices such as field programmable gate arrays (FPGAs). As known in the programmable logic arts, a programmable logic device includes logic blocks that may be configured to perform desired logical functions. In the present invention, the logic blocks may be configured to perform the function of the comparison stage 120 (FIGS. 1 and 4) for testing embedded memory (s) integrated with the programmable logic device (PLD). Advantageously, after the embedded memory(s) have been verified, the logic blocks may be reconfigured for whatever purpose the user desires in normal operation. Accordingly, there is no die overhead for implementing the partial BIST verification architecture within a PLD.

Figure 5:
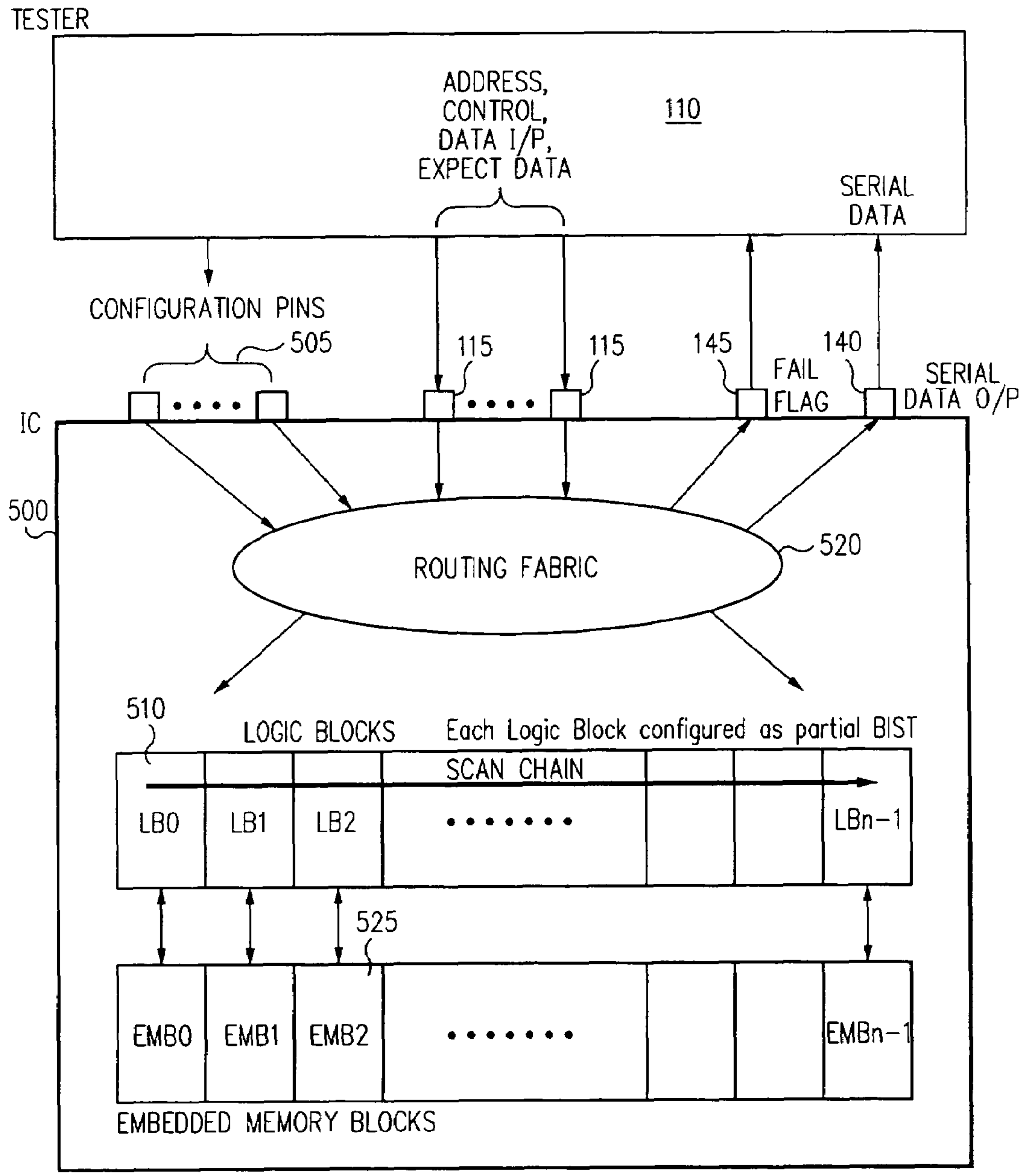
FIG. 5 is a block diagram of a field programmable gate array (FPGA) configured to implement a partial BIST embedded memory testing architecture in accordance with an embodiment of the invention.

Turning now to FIG. 5, an exemplary implementation of a partial BIST verification scheme within a conventional FPGA 500 is illustrated. FPGA 500 includes a plurality of logic blocks 510 that may be configured to perform desired logical functions using configuration signals coupled through configuration pins 505 and a routing fabric 520. In this embodiment, the desired logical function is to implement comparison stage 120 as discussed previously. In the embodiment illustrated, FPGA 500 includes a plurality of embedded memories 525. Thus, logic blocks 510 are configured to form comparison stage 120 as discussed with respect to FIG. 4. During verification, pins 115, 145, and 140 all function as described previously. However, upon completion of verification, these pins may be re-used for whatever purpose a user desires. Similarly, logic blocks 510 may also be reconfigured after verification of embedded memories 525. It will be appreciated that the number of logic blocks 510 required to implement a compare stage and shift register stage for a given embedded memory 525 will depend upon the equivalent number of logic gates a logic block 510 represents. In the embodiment illustrated, it is assumed that a single logic block 510 for each embedded memory 525 is adequate to perform these functions. However, the required number of logic blocks to implement comparison stage 120 in any given PLD will vary depending upon the particular logic block architecture.

Figure 6:
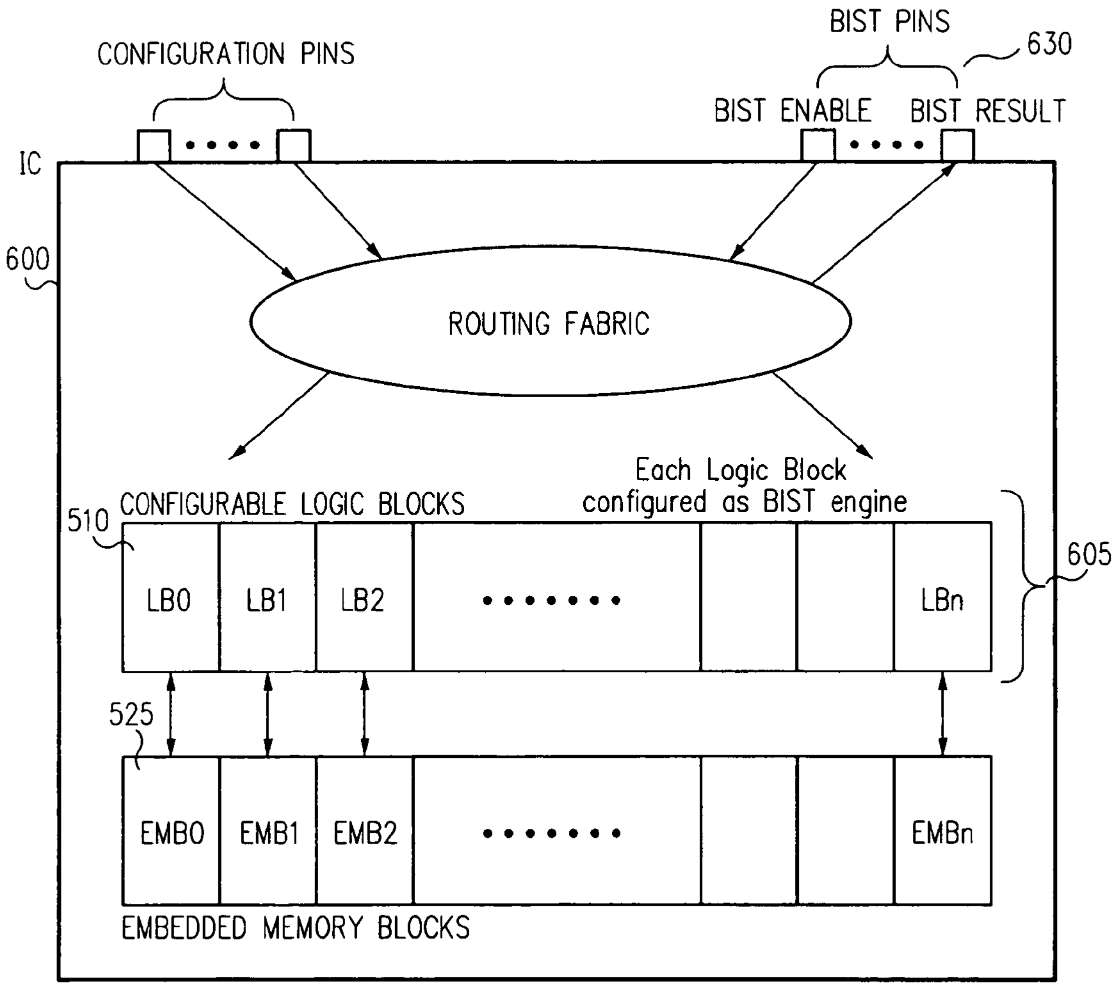
FIG. 6 is a block diagram of an FPGA configured to implement a full BIST embedded memory testing architecture in accordance with an embodiment of the invention.

The partial BIST embedded memory verification for FPGA 500 has the advantages over an on-chip BIST engine implementation or conventional tester implementation discussed previously. However, there may be embodiments wherein a user does not want to use an external tester to verify embedded memory operation. In such cases, the programmable logic device itself could be configured to implement a conventional on-chip BIST engine. For example, turning now to FIG. 6, an FPGA 600 configured to include an on-chip BIST engine 605 for the verification of embedded memories 525 is illustrated. FPGA 600 includes configuration pins 505, routing fabric 520, and logic blocks 510 as discussed with respect to FIG. 5. Logic blocks 510 are configured using configuration data routed through pins 505 and routing fabric 520 to implement on-chip BIST engine 605. Thus, BIST engine 605 generates test vectors, configures embedded memories 525 with the test vectors, retrieves the test vectors from the configured embedded memories 525, and compares the retrieved test vectors to the expected results as known in the arts for BIST engines. A set of pins 630 may be used to couple BIST signals such as a BIST enable and a BIST result signal to external devices. In contrast to the partial BIST verification scheme discussed herein, BIST engine 605 may be denoted as a "full BIST" engine. However, both the full and partial BIST engine implementations shares the advantage of having no die overhead. In an alternative embodiment, BIST engine 605 may also be configured to perform built-in-self-repair (BISR) functions.

Those of ordinary skill in the art will appreciate that the embedded memory testing architecture described herein may be implemented in numerous alternative embodiments. Accordingly, the above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention

We claim:

1. A method of testing memory function in an integrated circuit having embedded memory with multiple addresses to which data can be stored, comprising:

storing multiple test vectors from an external tester to addresses in embedded memory;

reading from the external tester a first address in the memory to retrieve a first test vector;

comparing within the integrated circuit the bits of the retrieved first test vector to corresponding bits of an expected test vector, the comparing producing a first group of comparison bits that indicates on a bit-by-bit basis whether a fault exists in the memory;

storing the first group of comparison bits;

reading from a second address in embedded memory to retrieve a second test vector;

comparing within the integrated circuit the bits of the retrieved second test vector to corresponding bits of an expected test vector, the comparing producing a second group of comparison bits that indicates on a bit-by-bit basis whether a fault exists in the memory; and logically combining the second group of comparison bits with the previously stored first group of comparison bits so as to preserve the state of a comparison bit that indicates a fault exists in the memory.

2. The method of claim 1, including:

for the remaining addresses in the memory, repeating the steps of reading an address, comparing bits of vectors, and logically combining groups of comparison bits; and asserting a failure flag once the state of a comparison bit indicates a fault exists in the memory.

3. The method of claim 1, wherein the comparing step comprises XORing the bits of a retrieved test vector to corresponding bits of an expected test vector.

4. The method of claim 1, wherein the logically combining step comprises ORing the second group of comparison bits with the previously stored first group of comparison bits.

* * * * *